United States Patent [19]
Russell

[11] 3,931,617
[45] Jan. 6, 1976

[54] COLLECTOR-UP DYNAMIC MEMORY CELL

[75] Inventor: Lewis K. Russell, San Jose, Calif.

[73] Assignee: Signetics Corporation, Sunnyvale, Calif.

[22] Filed: Oct. 7, 1974

[21] Appl. No.: 512,909

[52] U.S. Cl. .............................. 340/173 R; 307/238
[51] Int. Cl.² .......................................... G11C 11/40
[58] Field of Search ............... 340/173 R, 173 FF; 307/238; 357/46

[56] References Cited
UNITED STATES PATENTS
3,745,539   7/1973   Davidson ...................... 340/173 R

*Primary Examiner*—Terrell W. Fears
*Attorney, Agent, or Firm*—Flehr, Hohbach, Test

[57] ABSTRACT

A bipolar collector-up dynamic memory cell of the type utilized for storing information by writing and alternately reading information on a word line in response to a bit signal input. The memory cell includes a semiconductor body of one conductivity type having a planar surface, and a first transistor formed in the body having emitter, base and collector regions. The emitter is coupled to the word line and the base is coupled to the bit signal input. The collector region is of opposite conductivity type and is formed in the body extending to the surface to form a junction boundary between the collector and the body capable of exhibiting capacitance thereacross. A second transistor is formed in the body having emitter, base and collector regions. The base region is coupled to the bit signal input. The emitter and collector regions are connected between the word line and the collector of the first transistor and are capable of providing a forward current path from said first transistor collector to the word line. Means is also disclosed for writing and reading logic one and zero information bits in the memory cell.

5 Claims, 7 Drawing Figures

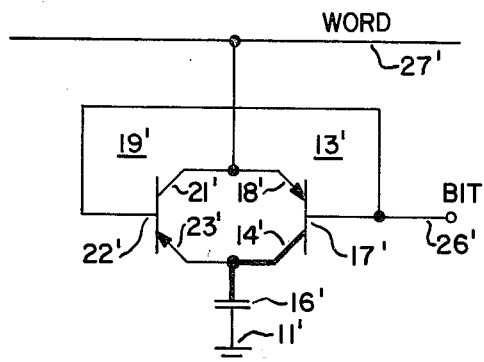
FIG.—1
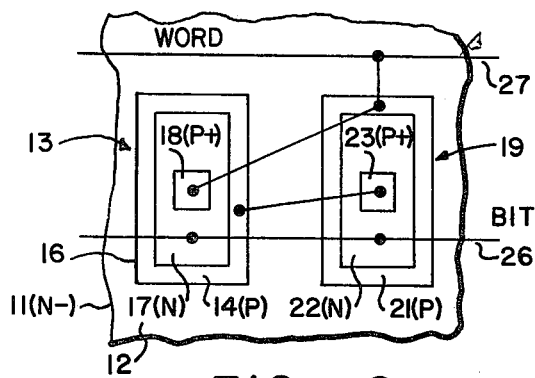
FIG.—2
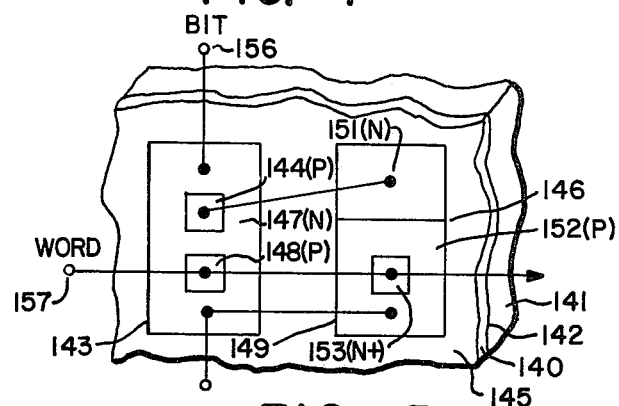
FIG.—5
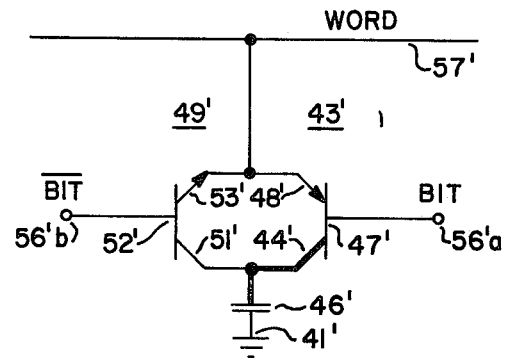
FIG.—3
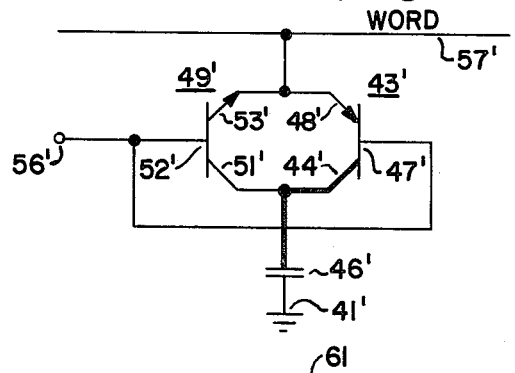
FIG.—4A
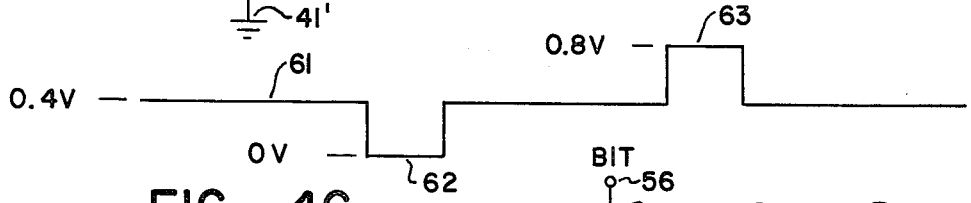
FIG.—4C
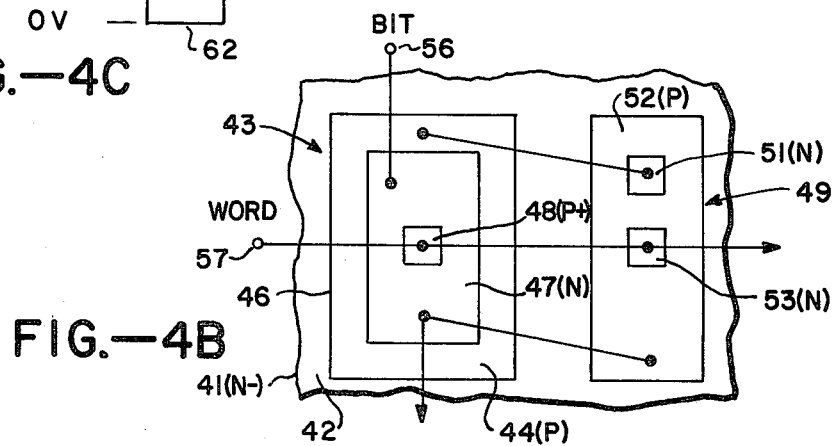
FIG.—4B

COLLECTOR-UP DYNAMIC MEMORY CELL

BACKGROUND OF THE INVENTION

This invention relates generally to a dynamic bipolar semiconductor structure and method of operation. More particularly, this invention relates to a dynamic bipolar semiconductor structure utilized as a memory cell for storing information bits.

Although dynamic memory cells have heretofore been provided, such structures have limited operational speeds and have occupied excessive areas in a semiconductor body. Thus there is a need for a high performance dynamic memory cell which occupies reduced semiconductor area and operates at increased speeds.

OBJECTS AND SUMMARY OF THE INVENTION

Accordingly, it is a general object of the present invention to provide an improved performance, high density and high speed bipolar dynamic memory cell.

It is a particular object of the present invention to provide an improved dynamic memory cell which may be formed in relatively high density arrays and which operates at greatly increased operational speeds.

Further, it is a particular object of the present invention to provide an improved collector-up dynamic memory cell which may be formed in relatively high density arrays and which operates at greatly increased operational speeds.

The foregoing and other objects of the invention are achieved in a dynamic memory cell semiconductor structure of the type utilized for storing information by writing and alternately reading information on a word line in response to a bit signal input. The memory cell includes a semiconductor body of one conductivity type having a planar surface. A first transistor is formed in the body having emitter, base and collector regions. The emitter is coupled to the word line and the base is coupled to the bit signal input. The collector region is of opposite conductivity type and is formed in the body extending to said surface to form a junction boundary between the collector and the body. The junction boundary is capable of exhibiting capacitance thereacross. A second transistor is formed in the body having emitter, base and collector regions. The base region is coupled to the bit signal input. The emitter and collector regions are connected between the word line and the collector of the first transistor and are capable of providing a forward current path from said first transistor collector to said word line.

DESCRIPTION OF THE DRAWINGS

FIG. 1 is a schematic diagram of the electrical equivalent circuit of the bipolar dynamic memory cell.

FIG. 2 is a top view of a portion of a semiconductor body including the dynamic memory cell having a plurality of regions.

FIG. 3 is an electrical equivalent of an additional embodiment of the dynamic memory cell having first and second inputs.

FIG. 4A is an electrical equivalent circuit of an additional embodiment of the FIG. 3 circuit.

FIG. 4B is a top view of a portion of a semiconductor body including the dynamic memory cell configured to provide the electrical equivalent circuit of FIG. 4A.

FIG. 4C is a typical input signal waveform for the circuit of FIG. 4A.

FIG. 5 is a top view of a portion of a semiconductor body showing an additional embodiment of the dynamic memory cell.

DESCRIPTION OF THE PREFERRED EMBODIMENTS

A plurality of bipolar dynamic memory cell structures and corresponding electrical equivalent circuits are shown in the accompanying FIGS. 1–5. As is well known, dynamic logic utilizes active devices which may be selectively and synchronously turned off and on as a function of system or sub-system timing. Capacitive charge storage is temporarily used to retain information between device clocking periods. Further, stored information is periodically refreshed as required to retain the information. Briefly, in general overview of the present invention, the bipolar structures provide a first transistor which in response to a bit signal input writes information by storing capacitive charge at a PN junction boundary. The stored information may be selectively read by causing a second transistor to provide a current path to discharge the capacitance and thereby provide a read output from the cell.

Referring to FIGS. 1 and 2 the respective electrical circuit and memory cell structures are shown. Reference numbers of the FIG. 2 structure correspond with the prime reference numbers of the FIG. 1 equivalent circuit. Referring to FIG. 1, a first PNP transistor 13' has a collector 14' connected to the semiconductor body 11' via storage capacitance 16'. Transistor 13' has base 17' connected to bit input terminal 26'. The emitter 18' of transistor 13' is connected to collector 21' of second transistor 19'. Transistor 19' has base 22' connected to bit input terminal 26' and emitter 23' connected to collector 14' of transistor 13'. Collector 21' of transistgor 19' is connected to word line 27'. The semiconductor structure corresponding to FIG. 1 is shown in FIG. 2. An N-type semiconductor body 11 has a substantially planar surface 12. Spaced P-regions 14 and 21 may be simultaneously formed in body 11 extending to surface 12. A PN junction boundry 16 is formed thereby between region 14 and body 11. Next N-type regions 17 and 22 may be simultaneously formed within spaced regions 14 and 21 extending to surface 12. Next P+ regions 18 and 23 may be formed within regions 17 and 22 extending to surface 12. Next conventional ohmic contacts and interconnections such as a patterned contact and interconnect aluminum layer is formed overlying surface 12 to connect the respective regions as previously discussed in conjunction with the circuit of FIG. 1.

Turning to a write and read operation, a write and read of logic one and zero information bits may be observed with reference to FIG. 1. Means for writing and reading may include a voltage supply connected between body or ground 11' and bit and word terminals 26' and 27' respectively where a "high" voltage or state with respect to body 11' and a "low" voltage or state with respect to 11' are utilized for operation. To write a "one" word line 27' is caused to assume a "high" voltage or state and bit line 26' a "low" voltage or state, thereby causing transistor 13' to assume a low impedance from emitter 18' to collector 14' and capacitance 16' is charged from the word line. To write a "zero" word line 27' is caused to assume a low state thereby causing transistor 19' to assume a low impedance from emitter to collector and discharging capacitance 16' on the word line 27'. Means for reading either a "one" or a "zero" may include any conventional means for detecting and measuring current, such as a current amplifier and indicator detecting and measuring current on word line 27'. To read a "one" word line 27' is caused to assume a low state and bit signal line 26' a low state thereby causing capacitance 16' to discharge via transistor 19' on word line 27' and providing a corresponding current which is detected as a "one." To read a "zero," word line 27' is caused to assume a low state and bit signal line 26' a low state. Zero current, that is the lack of charge on capacitance 16', is detected on the word line thereby reading a "zero."

Referring to FIG. 3, a circuit is shown which is compatible with collector-up transistor logic as disclosed in copending COLLECTOR-UP SEMICONDUCTOR STRUCTURE AND METHOD, Ser. No. 454,789, filed, Mar. 26, 1974, invented by, Lewis K. Russell. The circuit references may be identical to those reference call-outs of FIG. 1 with the references incremented by 30 to denote the like FIG. 3 circuit elements. In collector-up logic and similar integrated injection logic, a supply voltage of 0.8 volts provides a first logic level of approximately 0.7 – 0.8 volts and a second logic level of 0.02 volts. It is however necessary that both the bit signal and bit signal complement be provided to separate base inputs of each of transistors 49' and 43' to read out the "zero" or "one." The circuit of FIG. 3 corresponds to that of FIG. 1 differing only in that an NPN transistor 49' is substituted for transistor 19' and bit line 56' has inputs 56'a and 56'b for bit and bit complement inputs.

The circuit illustrated in FIG. 4A is similar to the circuit of FIG. 3, except that the bit signal inputs are both connected to a single input line 56'. FIG. 4B illustrates a semiconductor structure embodying the circuit of FIG. 4A. An N-type semiconductor body 41 having a surface 42 has spaced P-regions 44 and 52 simultaneously formed in said body extending to surface 42. A PN junction boundry 46 is thereby formed. Next, a single N-region 47 is formed within region 44 and extends to surface 42. Simultaneous with the formation of region 47, spaced N-type regions 51 and 53 may be formed within regions 52 and likewise extending to surface 42. Next, a P+ region 48 is formed within region 47 extending to surface 42. Conventional ohmic contacts may be made to the respective regions and the regions interconnected by a patterned contacting and interconnecting aluminum layer overlying surface 42. The respective regions are interconnected as shown in the circuits of FIG. 4A. Specifically emitters 53' and 48' are connected to word line 57', bases 52' and 47' are connected to bit signal terminal 56' and collectors 51' and 44' are connected via PN junction boundary capacitance 46' to body 41'.

Turning to operation, it is to be noted that the read and write operation is similar to that previously discussed in conjunction with FIGS. 1 and 2 using the read/write signal as shown in FIG. 4C. For a "read in" the 0.4 volt reference level 61 is caused to assume a zero volt, reference level 62. Further a "write out" operation may be performed by causing the bit signal to go from 0.4 volt reference level 61 to 0.8 volt refernece level 63. In brief, when the bit signal level assumes a zero volt level transistor 43' assumes a low impedance state thereby permitting a "read in" operation. Further, when the bit signal is caused to assume a 0.8 volt level the NPN transistor 49' is caused to assume a low impedance state thereby permitting a "write out" signal on word line 57'.

Referring to FIG. 5, an additional structural embodiment on the FIG. 4A circuit is shown. Structural element reference correspond to the prime reference circuit elements of FIG. 4A with the additional reference prefix of 100 denoting the FIG. 5 structure. First and second transistors 143 and 149 are carried by a semiconductor body 141 having a planar surface 142. A conventional dielectric isolation layer 140 is formed on surface 142 and has a top surface 145. Transistors 143 and 149 are thus isolated from each other as is conventionally known in the art. Body 141 may extend to form a single region of either of the transistors or may merely be a supporting member. Transistor 143 includes a N region 147 formed in body 141 and extending to surface 142. Spaced P regions 144 and 148 are formed in region 147 and extend to surface 142. Transistor 149 is isolated from transistor 143 and includes an N region 151 and abutting and contacting P-region 152, both formed in body 141 and extending to surface 142. An N+ region 153 is formed within region 152 extending to surface 142. Conventional contacts and interconnections respectively connect regions 148 and 153 to word line 157, region 144 to region 151, and regions 153 and 147 to bit input 156. By virtue of the capacitance between the collector-base junction of transistor 149 in relation to body 141 charge may be selectively stored in the manner previously described. It is believed that writing with the PNP transistor 143 will prove to be excellent because the body 141 will be less likely to collect and sap the current gain of this transistor in comparison to the previously discussed structures. Similarly a relatively fast read operation occurs by virtue of the vertical NPN transistor 149 which has a relatively high current gain. Operation of the FIG. 5 structure is as previously discussed in conjunction with the FIG. 4A circuit operation.

It is therefore apparent that there has been provided an improved performance, high density and high speed bipolar dynamic memory cell.

I claim:

1. In a bipolar dynamic memory cell of the type utilized for storing information by writing and alternately reading information on a word line in response to a bit signal input, a semiconductor body of one conductivity type having a planar surface, a first transistor formed in said body having emitter, base and collector regions, said emitter region being coupled to said word line and said base region being coupled to said bit signal input, said collector region being of a second conductivity type and being formed in said body and extending to said surface to form a junction boundary of predetermined capacitance between said collector region and said body, a second transistor formed in said body and having emitter, base and collector regions, the base region of said second transistor being coupled to said bit signal input, and the emitter and collector regions of said second transistor being connected to the capacitor formed by the junction and to said word line to provide a controlled current path between the same.

2. A memory cell as in claim 1 wherein said junction boundary is a PN semiconductor junction.

3. A memory cell as in claim 1 wherein said junction boundary is a semiconductor-dielectric-insulator-semiconductor junction.

4. A memory cell as in claim 1 wherein said first transistor is a PNP transistor and the body is of N-type material.

5. In a method for writing information in a dynamic memory cell and reading the information out of the cell onto a word line in response to a bit signal input, said cell being of the type including first and second transistors formed in a semiconductor body of one conductivity type wherein a junction boundary of predetermined capacitance is formed between the collector of said first transistor and said body, and said second transistor is connected between said collector and said word line to provide a forward current path from the capacitor formed by the junction to the word line, the steps of: applying input signals of predetermined level to said word line and to said bit line to condition the first transistor for charging said junction capacitor from said word line, applying input signals of predetermined level to said word line and to said bit line to condition the second transistor for discharging said capacitor into said word line, and monitoring the current in said word line to determine the level of charge stored in the capacitor.

* * * * *